US008629064B2

(12) United States Patent
Li et al.

(10) Patent No.: US 8,629,064 B2
(45) Date of Patent: Jan. 14, 2014

(54) MULTIPLE PATTERNING LITHOGRAPHY USING SPACER AND SELF-ALIGNED ASSIST PATTERNS

(75) Inventors: Xiaoyang Li, Mountain View, CA (US); Duan-Fu Stephen Hsu, Fremont, CA (US)

(73) Assignee: ASML Netherlands B.V., Veldhoven (NL)

( * ) Notice: Subject to any disclaimer, the term of this patent is extended or adjusted under 35 U.S.C. 154(b) by 87 days.

(21) Appl. No.: 13/167,681

(22) Filed: Jun. 23, 2011

(65) Prior Publication Data
US 2011/0318927 A1    Dec. 29, 2011

Related U.S. Application Data

(60) Provisional application No. 61/359,209, filed on Jun. 28, 2010.

(51) Int. Cl.
*H01L 21/311*    (2006.01)

(52) U.S. Cl.
USPC ........... 438/696; 438/689; 438/690; 438/691; 438/692; 438/694; 438/737; 438/738; 257/E21.038; 257/E21.039; 257/E21.235; 257/E21.236; 257/E21.314

(58) Field of Classification Search
None
See application file for complete search history.

(56) References Cited

U.S. PATENT DOCUMENTS

2007/0238053 A1*  10/2007  Hashimoto .................. 430/313

FOREIGN PATENT DOCUMENTS

| JP | 2008-090286 | 4/2008 |
|---|---|---|
| JP | 2008-122928 | 5/2008 |
| JP | 2008-233383 | 10/2008 |
| JP | 2009-076902 | 4/2009 |
| KR | 10-0780775 | 11/2007 |
| KR | 10-0935734 | 1/2010 |
| TW | 200802536 | 1/2008 |
| TW | 200951634 | 12/2009 |

OTHER PUBLICATIONS

M. Madou, Fundamentals of Microfabrication, CRC Press, 1997, p. 9.*
Korean Office Action dated Aug. 16, 2012 in corresponding Korean Patent Application No. 10-2011-0061560.
Lim, Chang-Moon et al., "Positive and Negative Tone Double Patterning Lithography for 50nm Flash Memory," (2006) Proc. of SPIE, vol. 6154, pp. 615410-1-615410-8.
Jung, Woo-Yung, "Patterning with Spacer for Expanding the Resolution Limit of Current Lithography Tool," (2006) Proc. of SPIE, vol. 6156, pp. 61561J-1-61561J-9.

* cited by examiner

*Primary Examiner* — Lan Vinh
*Assistant Examiner* — Jiong-Ping Lu
(74) *Attorney, Agent, or Firm* — Pillsbury Winthrop Shaw Pittman LLP

(57)    ABSTRACT

The present invention relates to lithographic apparatuses and processes, and more particularly to multiple patterning lithography for printing target patterns beyond the limits of resolution of the lithographic apparatus. Self-aligned assist pattern (SAP) is derived from original design layout in an automated manner using geometric Boolean operations based on some predefined design rules, and are included in the mask layout for efficient self-alignment of various sub-layouts of the target pattern during a multiple patterning lithography process. SAP can be of any shape and size, and can have continuous features (e.g., a ring), or discontinuous (e.g., bars not connected to each other) features. An end-to-end multiple patterning lithography using spacer and SAP may use positive tone lithography, and/or negative tone lithography for line and/or space printing.

18 Claims, 23 Drawing Sheets

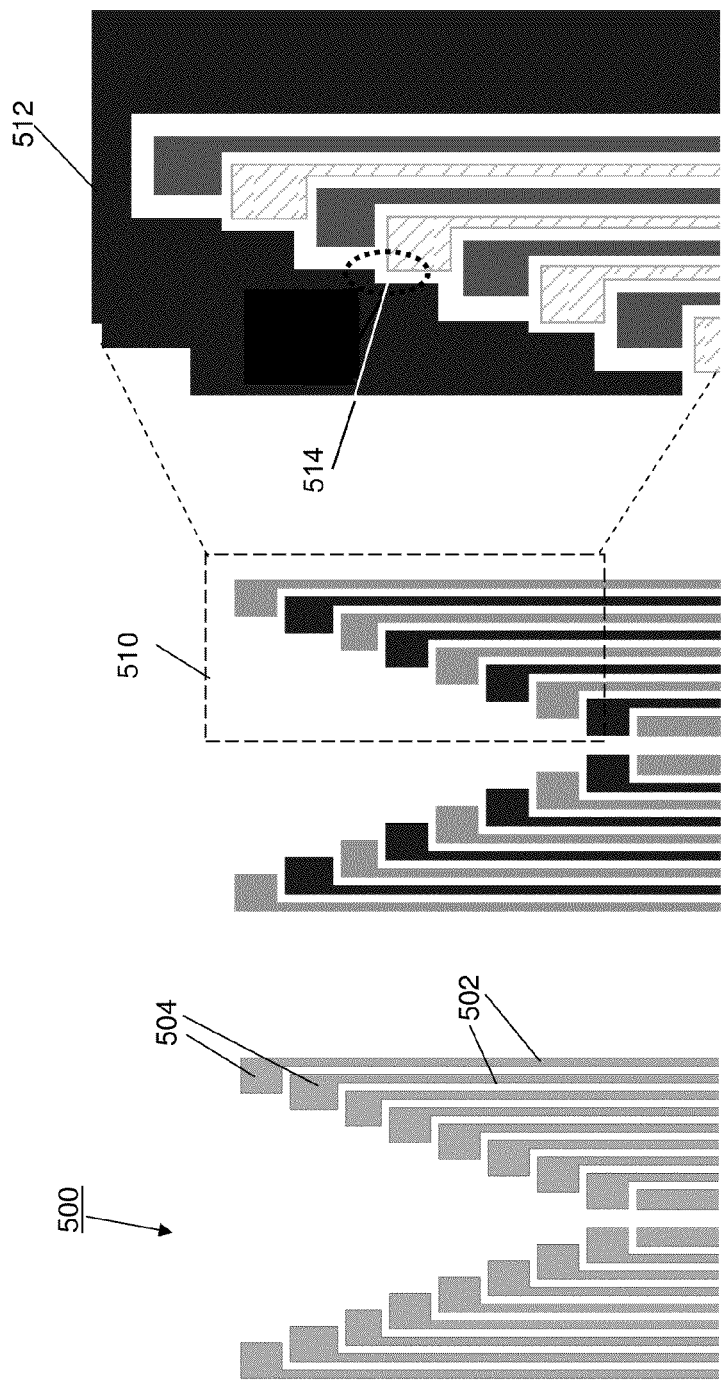

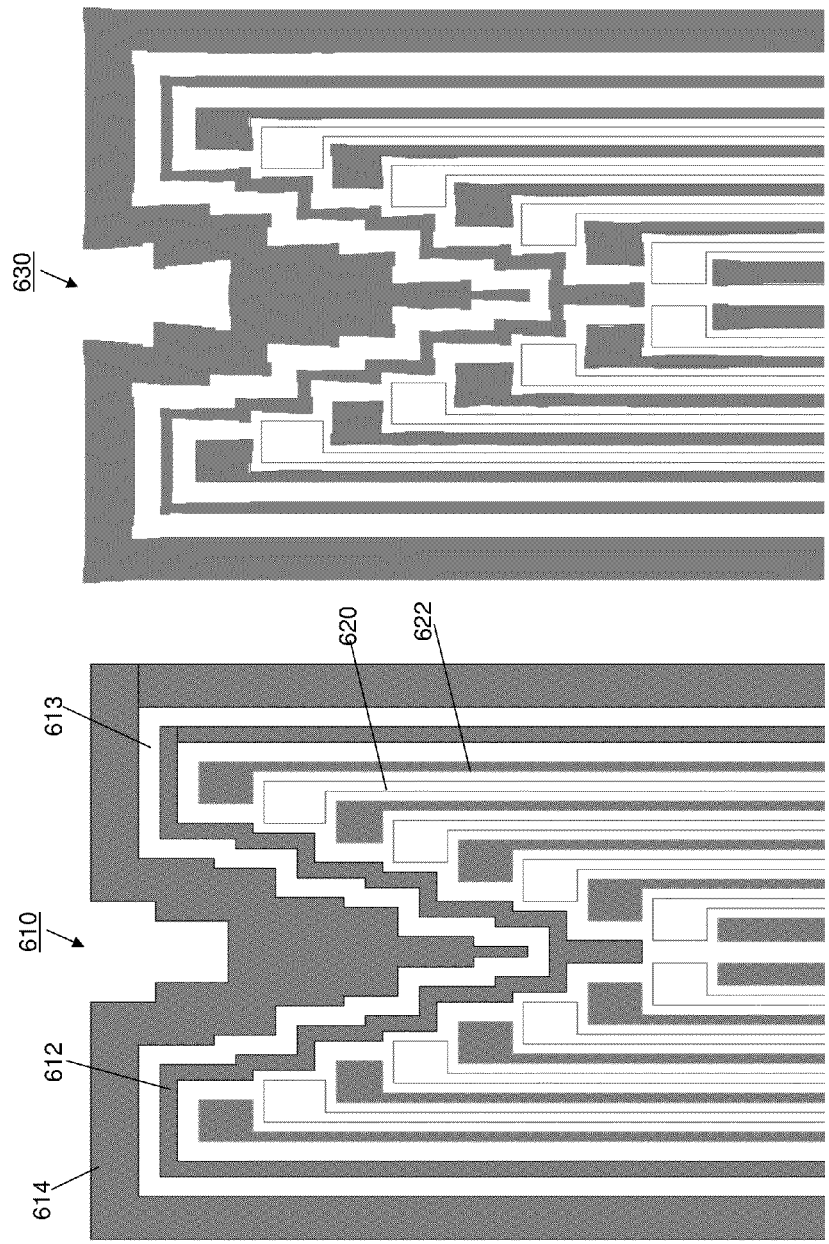

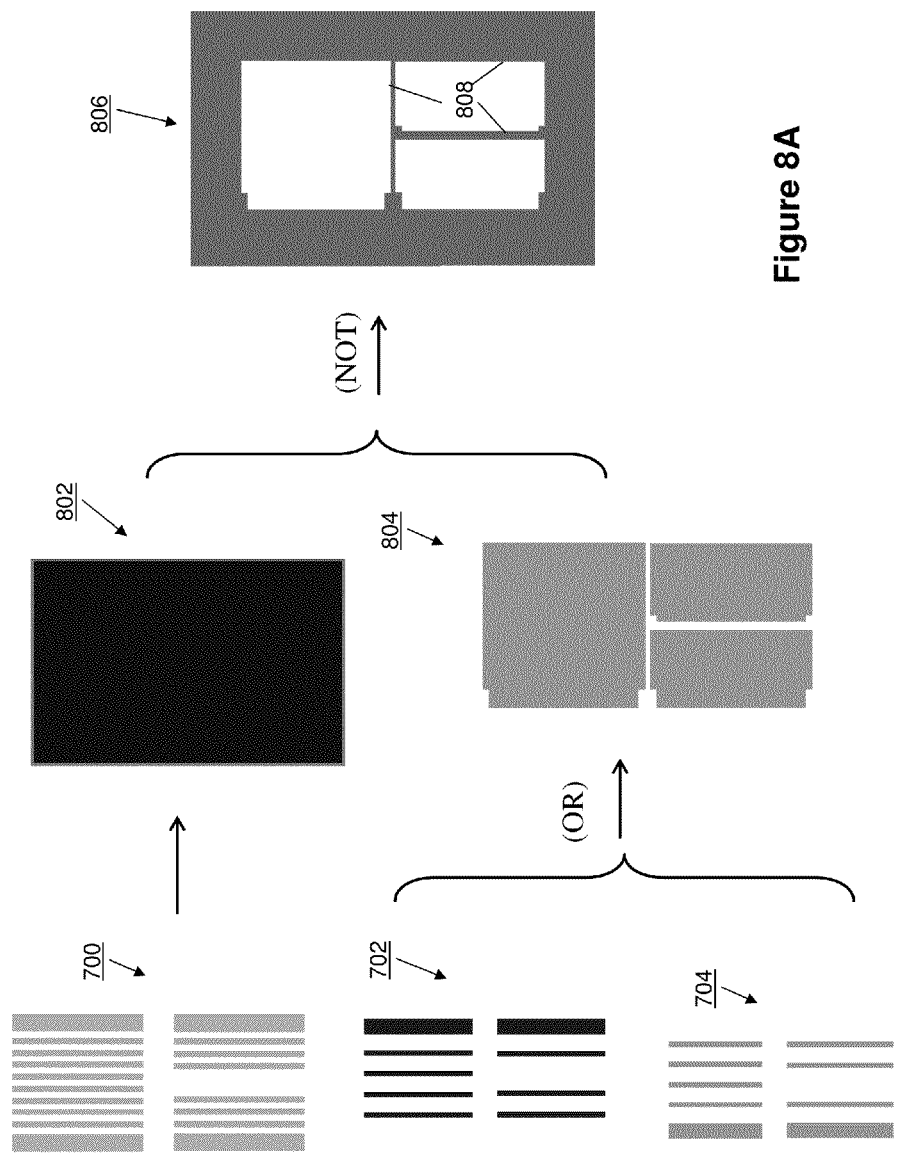

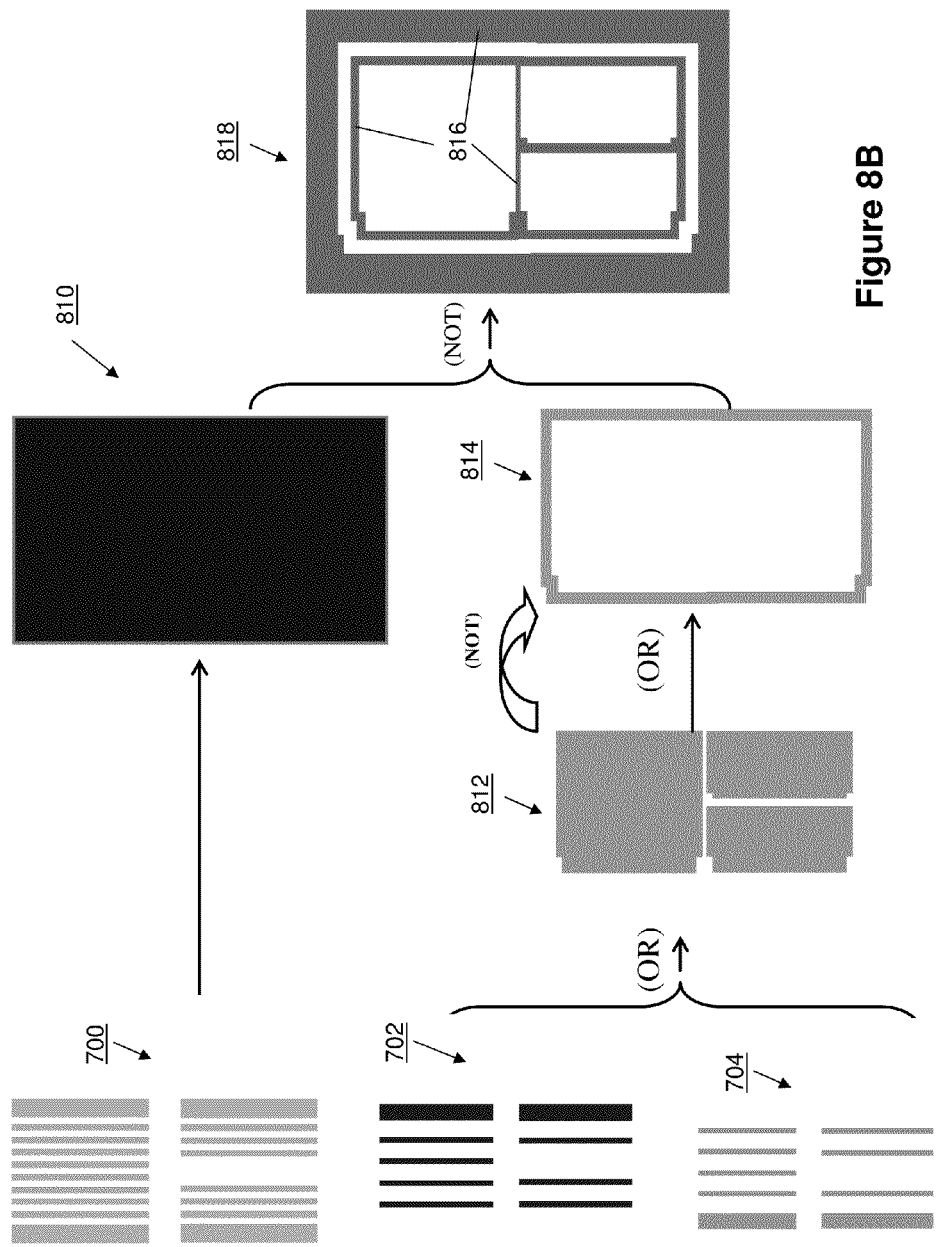

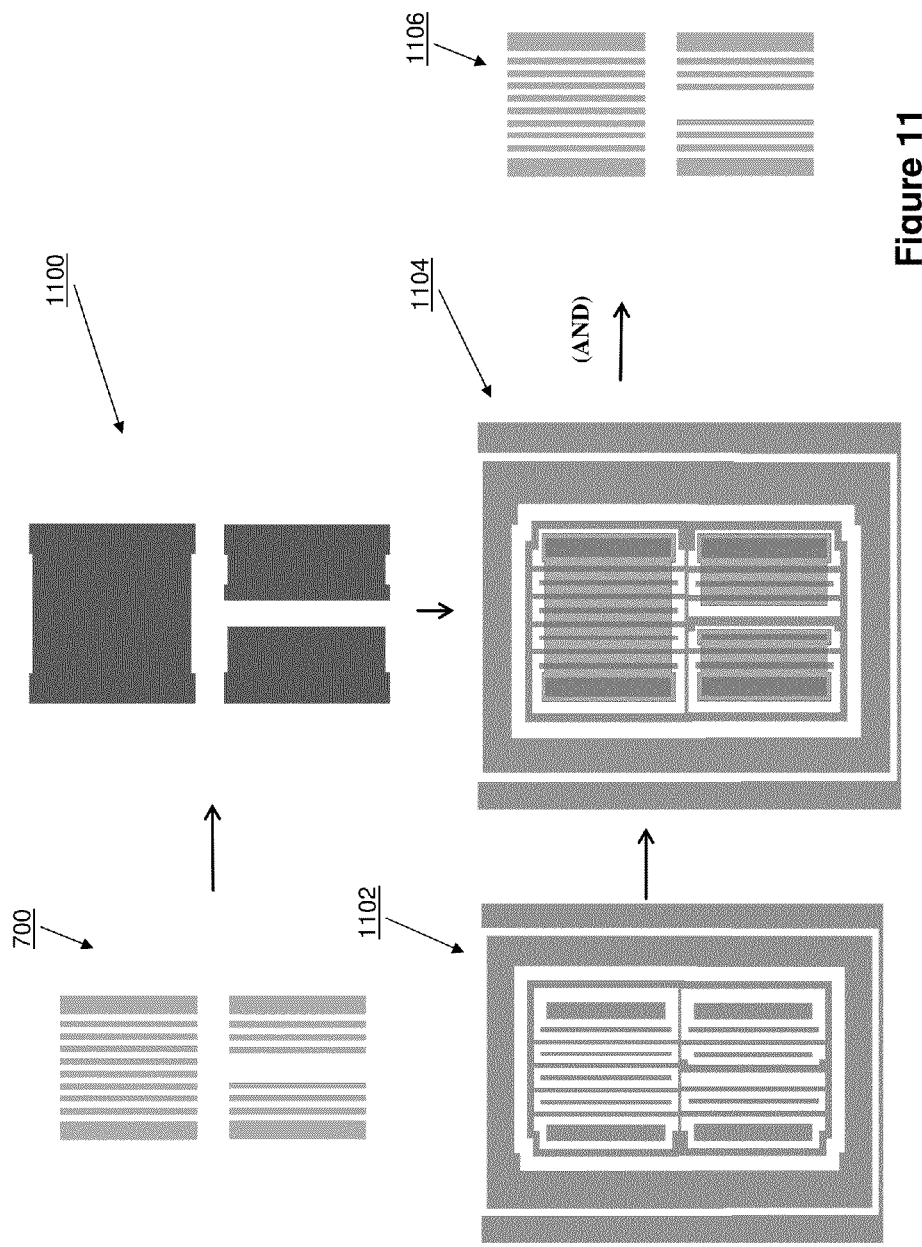

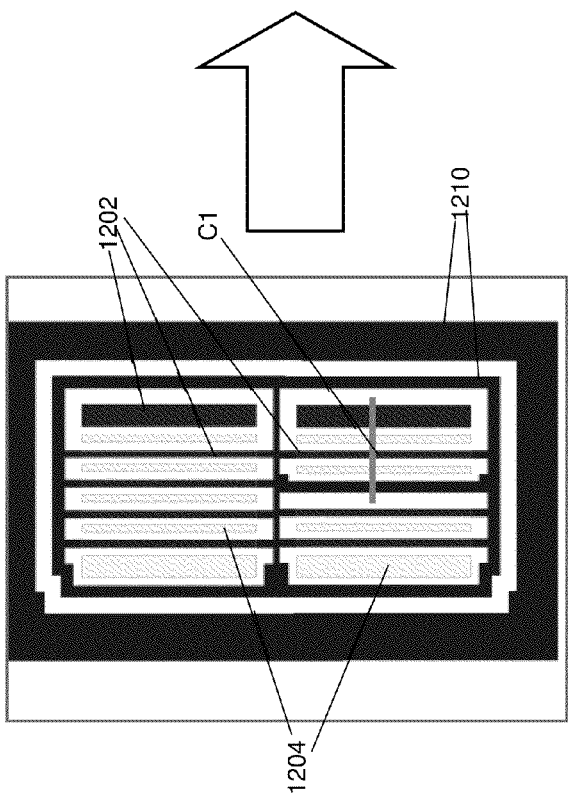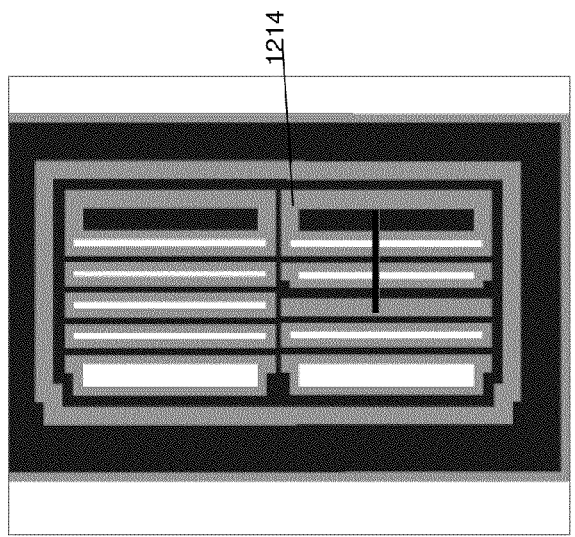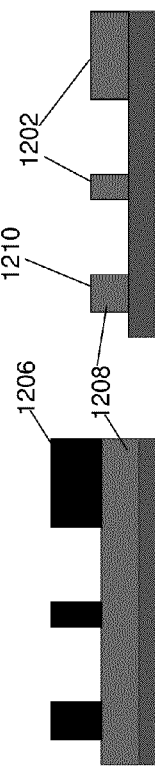
Figure 12A
Figure 12B
Figure 12C
Figure 12D
Figure 12E

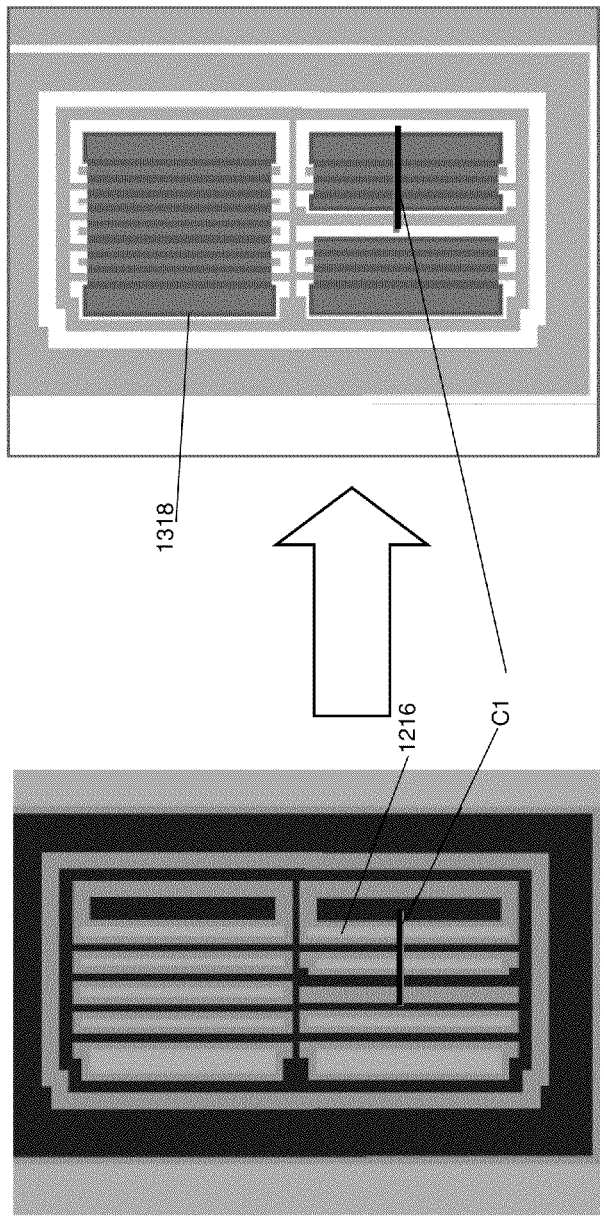
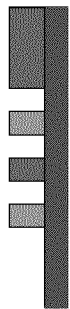
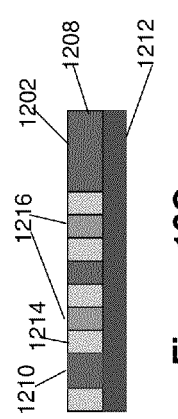
Figure 13A
Figure 13B
Figure 13C
Figure 13D

MULTIPLE PATTERNING LITHOGRAPHY USING SPACER AND SELF-ALIGNED ASSIST PATTERNS

CROSS-REFERENCE TO RELATED APPLICATIONS

This application claims the benefit of U.S. Provisional Application No. 61/359,209 filed Jun. 28, 2010, which is incorporated herein by reference in its entirety.

FIELD OF THE INVENTION

The present invention relates to lithographic apparatuses and processes, and more particularly to multiple patterning lithography for printing patterns beyond the limits of resolution of the lithographic apparatus while accommodating multiple critical dimensions.

BACKGROUND OF THE RELATED ART

Lithographic apparatuses can be used, for example, in the manufacture of integrated circuits (ICs). In such a case, the mask may contain a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In one type of lithographic projection apparatus, each target portion is irradiated by exposing the entire mask pattern onto the target portion in one go; such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction.

In a manufacturing process using a lithographic projection apparatus, a mask pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g., an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc.

For the sake of simplicity, the projection system may hereinafter be referred to as the "lens"; however, this term should be broadly interpreted as encompassing various types of projection systems, including refractive optics, reflective optics, and catadioptric systems, for example. The radiation system may also include components operating according to any of these design types for directing, shaping or controlling the projection beam of radiation, and such components may also be referred to below, collectively or singularly, as a "lens".

The photolithographic masks referred to above comprise geometric patterns corresponding to the circuit components to be integrated onto a silicon wafer. The patterns used to create such masks are generated utilizing CAD (computer-aided design) programs, this process often being referred to as EDA (electronic design automation). Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes. Thus, the CD determines the overall size and density of the designed circuit. Of course, one of the goals in integrated circuit fabrication is to faithfully reproduce the original circuit design on the wafer (via the mask).

As semiconductor manufacturing processes continue to advance, the dimensions of circuit elements have continually been reduced while the amount of functional elements, such as transistors, per device has been steadily increasing over decades, following a trend commonly referred to as 'Moore's law'. At the current state of technology, critical layers of leading-edge devices are manufactured using optical lithographic projection systems known as scanners that project a mask image onto a substrate using illumination from a deep-ultraviolet laser light source, creating individual circuit features having dimensions well below 100 nm, i.e. less than half the wavelength of the projection light.

This process in which features with dimensions smaller than the classical resolution limit of an optical projection system are printed, is commonly known as low-$k_1$ lithography, according to the resolution formula $CD=k_1 \times \lambda/NA$, where $\lambda$, is the wavelength of radiation employed (currently in most cases 248 nm or 193 nm), NA is the numerical aperture of the projection optics, CD is the 'critical dimension'—generally the smallest feature size printed—and $k_1$ is an empirical resolution factor. In general, the smaller $k_1$, the more difficult it becomes to reproduce a pattern on the wafer that resembles the shape and dimensions planned by a circuit designer in order to achieve particular electrical functionality and performance. To overcome these difficulties, sophisticated fine-tuning steps are applied to the projection system as well as to the mask design. These include, for example, but not limited to, optimization of NA and optical coherence settings, customized illumination schemes, use of phase shifting masks, optical proximity correction (OPC) in the mask layout, or other methods generally defined as 'resolution enhancement techniques' (RET).

Double patterning lithography (DPL) is one of the methods to effectively overcome the resolution limit of lithographic exposure apparatus, especially, when further increase of NA is no longer a feasible option. In general, in double patterning lithography, dense target patterns, whose individual feature CD and/or inter-feature pitch is below the resolution limit of the lithography apparatus, are split in two parts (this process is referred to as "coloring"), such that, independently in each part, there is no resolution-related problems to overcome during pattern printing. The parts are patterned sequentially, interspersing features printed in the first lithography with features printed in the second lithography, to reproduce the entire pattern. Double patterning lithography may adopt a positive tone or a negative tone, as discussed, for example, in the reference, titled, "Positive and negative tone double patterning lithography for 50 nm flash memory," by Lim et al., published in Proceedings of SPIE vol. 6154, (2006). However, alignment of various parts of the target pattern with respect to each other is a challenging process in existing double patterning lithography processes, and is often associated with low yield due to alignment error.

To reduce the alignment error, a spacer has been used in the double patterning lithographic process flow. In one example, an amorphous carbon spacer is added, as described in an article titled, "Patterning with amorphous carbon spacer for expanding the resolution limit of current lithography tool," by Jung et al., published in Proceedings of SPIE vol. 6156 (2006). Spacer-assisted double patterning lithography method has been used for realizing volume manufacturing of the 32 nm technology node. Still, overlay control issue remains a source of error in existing spacer-assisted double patterning methods, especially for critical device features, such as, a polysilicon gate. Conventional spacer-assisted positive tone method can only print patterns with a single CD that are self-aligned. Additional mask and overlay-critical steps are needed for multiple CDs. Conventional spacer-assisted negative tone method can print different CDs, but self-alignment accuracy is often unacceptable without additional fine-tuning of a subsequent trimming method.

What is needed is a simpler alignment method, such as, a comprehensive automatic self-alignment method, to pattern multiple parts of a target pattern. Additionally, the self-alignment method should overcome or simplify overlay-related problems by adopting a suitable process flow that does not necessarily need to differentiate between critical and non-critical features of the target pattern, and therefore, avoids the need for stitching different parts of the target pattern.

SUMMARY OF THE INVENTION

Embodiments of the present invention provide methods, computer program products and apparatuses for spacer-assisted multiple patterning lithography for self-aligning various decomposed parts (referred to as sub-layouts) of a target pattern layout onto a substrate. It is noted that, though in most of the examples discussed in the specification, a target pattern layout is decomposed into two sub-layouts only, the scope of the invention is not limited by the number of sub-layouts. Hence, the "double patterning," encompasses multiple patterning methods as well, where more than two sub-layouts are involved. Self-aligned assist pattern (SAP) is derived from original design layout in an automated manner based on some predefined design rules, and SAP feature(s) are included in the mask layout for efficient self-alignment of various sub-layouts during a multiple patterning lithography process. Embodiments of the method are inherently suitable for overcoming overlay errors, as there is no need to overlay or stitching of non-critical parts of the target pattern layout onto the critical parts of the target pattern layout. As a result, multiple CDs can be accommodated inherently in the process flow without running into the problem of overlay.

SAP features can be of any shape (e.g., bars, lines, spaces, rings, regular or irregular shaped polygons, etc.) and size, and can be continuous (e.g., a ring), or discontinuous (e.g., bars not connected to each other). In some embodiments, discontinuous SAP features are modified to generate a complex interconnected SAP feature layout (e.g., lines are extended to merge with a ring).

The spacer and SAP-assisted process flow may adopt a dark field lithography, or a bright field lithography, or may adopt a method that uses dark field lithography in part, and light field lithography in part. Masks and resists are designed/chosen depending on whether a positive tone or negative tone multiple patterning lithography is being used. An end-to-end multiple patterning lithography may use positive tone lithography in part, and negative tone lithography in part.

The invention itself, together with further objects and advantages, can be better understood by reference to the following detailed description and the accompanying drawings.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 5A-C show decomposition of a target pattern layout and derivation of SAP features, according to an example of the present invention.

FIGS. 6A-H schematically illustrates results of a multiple patterning lithography at various steps of an example method of the present invention.

FIGS. 8A-B illustrates two different examples of peripheral SAP derivation from the decomposed sub-layouts of FIG. 7.

FIGS. 10 and 11 illustrate examples of space printing and line printing, respectively, using trim masks, according to two different embodiments of the present invention.

FIGS. 12A-12E depict example process flow for a first lithography step and spacer deposition, according to an example method embodiment of the present invention.

FIGS. 13A-13D depict remaining process flow following the step in FIG. 12E, when a negative photoresist process is adopted.

DETAILED DESCRIPTION OF THE PREFERRED EMBODIMENTS

The present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. Embodiments described as being implemented in software should not be limited thereto, but can include embodiments implemented in hardware, or combinations of software and hardware, and vice-versa, as will be apparent to those skilled in the art, unless otherwise specified herein. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

Although specific reference may be made in this text to the use of the invention in the manufacture of ICs, it should be explicitly understood that the invention has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

Figure 1A:
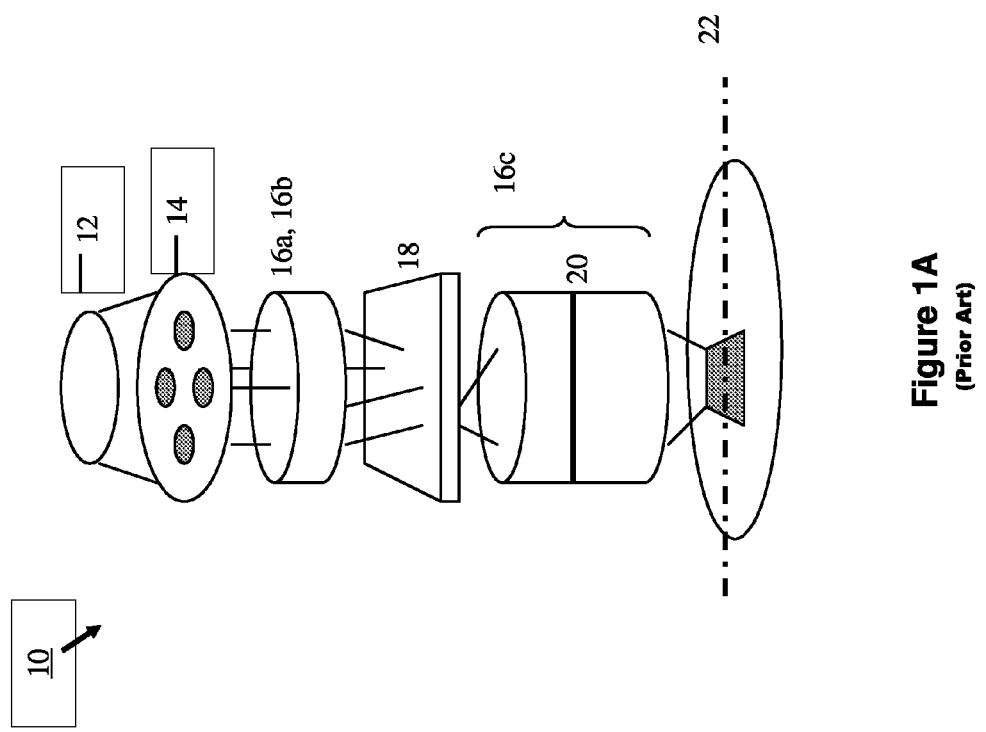
FIG. 1A is an exemplary block diagram illustrating a typical lithographic projection system.

General Environment in a Lithographic System for Implementing Example Embodiments of the Present Invention Prior to discussing the present invention, a brief discussion regarding the overall design and imaging process is provided. FIG. 1A illustrates an exemplary lithographic projection system 10. The major components are a light source 12, which may be a deep-ultraviolet excimer laser source, illumination optics which define the partial coherence (denoted as sigma) and which may include specific source shaping optics 14, 16a and 16b; a mask or reticle 18; and projection optics 16c that produce an image of the reticle pattern onto the wafer plane 22. An adjustable filter or aperture 20 at the pupil plane may restrict the range of beam angles that impinge on the wafer plane 22, where the largest possible angle defines the numerical aperture of the projection optics $NA=\sin(\Theta_{max})$.

Figure 1B:
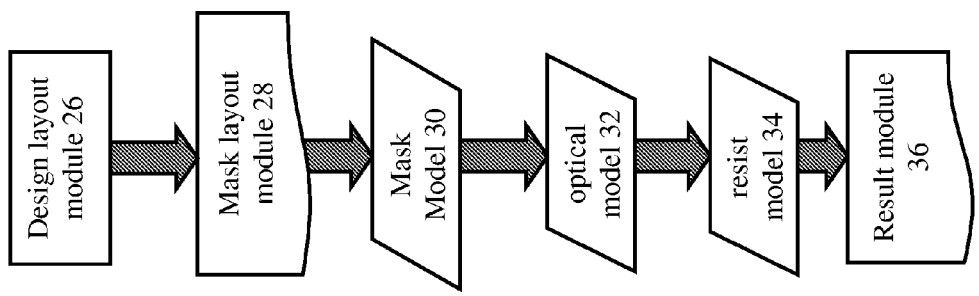
FIG. 1B is an exemplary block diagram illustrating the functional modules of a lithographic simulation model.

In a lithography system, these major system components can be described by separate functional modules, for example, as illustrated in FIG. 1B. Referring to FIG. 1B, the functional modules include the design layout module 26, which defines the target design; the mask layout module 28, which defines the mask to be utilized in the imaging process; the mask model module 30, which defines the model of the mask layout to be utilized during the simulation process; the optical model module 32, which defines the performance of the optical components of lithography system; and the resist model module 34, which defines the performance of the resist being utilized in the given process. As is known, the result of the simulation process produces, for example, predicted contours and CDs in the result module 36.

More specifically, it is noted that the properties of the illumination and projection optics are captured in the optical model 32 that includes, but not limited to, NA-sigma (σ) settings as well as any particular illumination source shape (e.g. off-axis light sources such as annular, quadrupole, and dipole, etc.). The optical properties of the photo-resist layer coated on a substrate—i.e. refractive index, film thickness, propagation and polarization effects—may also be captured as part of the optical model 32. The mask model 30 captures the design features of the reticle and may also include a representation of detailed physical properties of the mask. Finally, the resist model 34 describes the effects of chemical processes which occur during resist exposure, PEB and development, in order to predict, for example, contours of resist features formed on the substrate wafer.

The present invention is primarily related to the design layout module 26 and mask layout module 28, as shown in FIG. 1B. The target design, is generally provided in a standardized digital file format such as GDSII or OASIS. SAPs are derived from the target design, and are included in the mask layout.

Example Methods of the Present Invention

Figure 2:
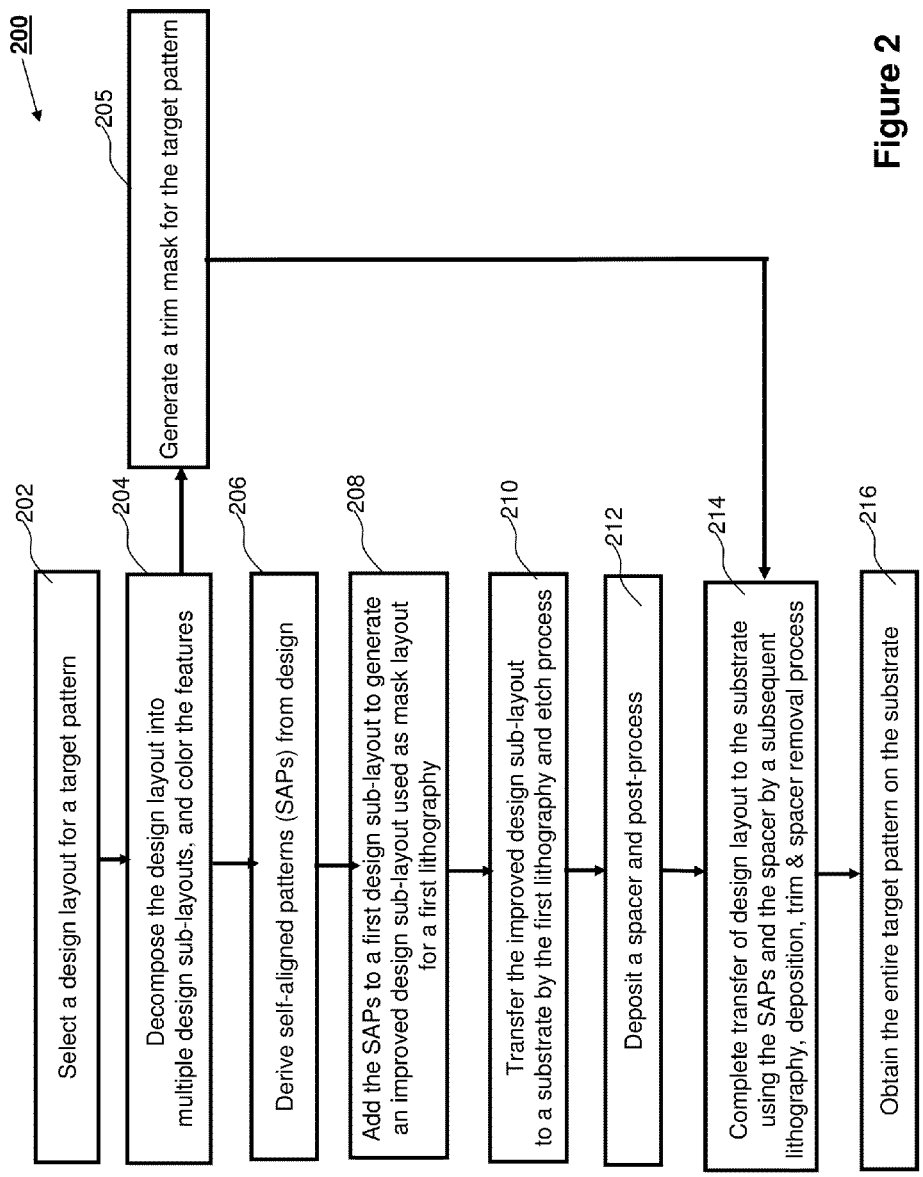
FIGS. 2-3 show example flowcharts illustrating various steps of the methods, according to embodiments of the present invention.

FIG. 2 is an exemplary flowchart illustrating the method of using SAPs and spacer in multiple patterning lithography, in accordance with an embodiment of the present invention.

Flowchart 200 in FIG. 2 shows some key steps of a method transferring a target pattern onto a substrate by incorporating SAP and spacers in a multiple patterning lithography, according to one example embodiment.

Flowchart 200 starts with step 202, where a design layout of a target pattern is selected. The design layout may be in the GDS or any other standard/custom digital format.

In step 204, the design layout is decomposed into at least two sub-layouts. A part of the decomposition is called "coloring". Coloring can be done using some predefined design rules. In one example, coloring is done based on separating geometries with different CDs, i.e. one of the sub-layouts accommodates features a first CD, and the other sub-layout accommodates features with a second CD. One of the sub-layouts is configured to facilitate in generating targets for adding a spacer layer. That sub-layout is referred to as a spacer-target sub-layout. The spacer-target sub-layout is configured to accommodate SAP as an add-on layout feature, so that a subsequent lithography mask layout includes the original features from the sub-layouts themselves, as well as the SAP features. This mask layout may be referred to as a improved spacer-target sub-layout. Note that an improved spacer-target sub-layout may accommodate selective features of the same "color" or multiple "colors."

In step 206, a singular SAP or a set of SAP features are derived from the original design layout. As will be explained further in detail with respect to 7-9, SAP may be auto generated applying geometric Boolean operations to features and properties included in the design layout. Although specifically not described in the example shown here, persons skilled in the art will appreciate that a final set of SAP features can be generated in an iterative process, where an initial set of SAP features is used to fine-tune a subsequent set of SAP features, until a final set of SAP features is generated that meets all the design rule criteria. Overall, SAP features are derived and included in the first lithography mask layout (generated from an "improved spacer-target sub-layout," that includes original features from the sub-layouts themselves and the derived SAP features), as shown in step 208. A physical mask for the first lithography process is made using the improved spacer-target sub-layout. Optionally, optical proximity correction (OPC) may be applied in the improved spacer-target-sub-layout.

Depending on the process flow, another physical mask, known as a trim mask, may also be made in parallel, as shown in step 205, and optionally, OPC may be applied to the trim mask pattern. The use of the trim mask is optional and may be used later in the process flow (after features of the spacer-target sub-layout have been lithographically transferred onto the substrate) to delineate/fine-tune/complete transfer of features that were not accommodated by the spacer-target sub-layout.

In step 210, features of the improved spacer-target sub-layout comprising the spacer-target sub-layout and the singular or multiple SAP features are transferred onto the substrate using standard photolithography and etch/planarization process. This is explained in greater detail later with respect to FIGS. 12A, 12C and 12D. Optionally, a hard mask may be used during this first lithography/etch process. Bright field or dark field mask may be used depending on the tone of lithography adopted.

In step 212, a spacer is formed. Spacer may be formed around the sidewalls of the lithographically transferred design-layout features and the SAP features printed on the substrate. Spacer may comprise amorphous carbon or other materials, according to the needs and suitability of a specific process flow. Spacer may be formed by a film deposition. Some post-processing may be required to planarize the deposited spacer film layer. Planarization may be done by chemical mechanical polishing (CMP) or etch back. All or most of the deposited spacer may be removed subsequently during the process flow. Therefore, at least a part of the spacer is used as a sacrificial layer. FIG. 12E shows spacer formation 1214 (see FIG. 12E) immediately adjacent to the lithographically transferred design sub-layout features and SAPs. Spacers define peripheral edges of the entire target pattern, as well as edges of individual features included in the target pattern. Specifically, edges of features of the sub-layout not printed in the first lithography are defined by spacers.

Figure 3:
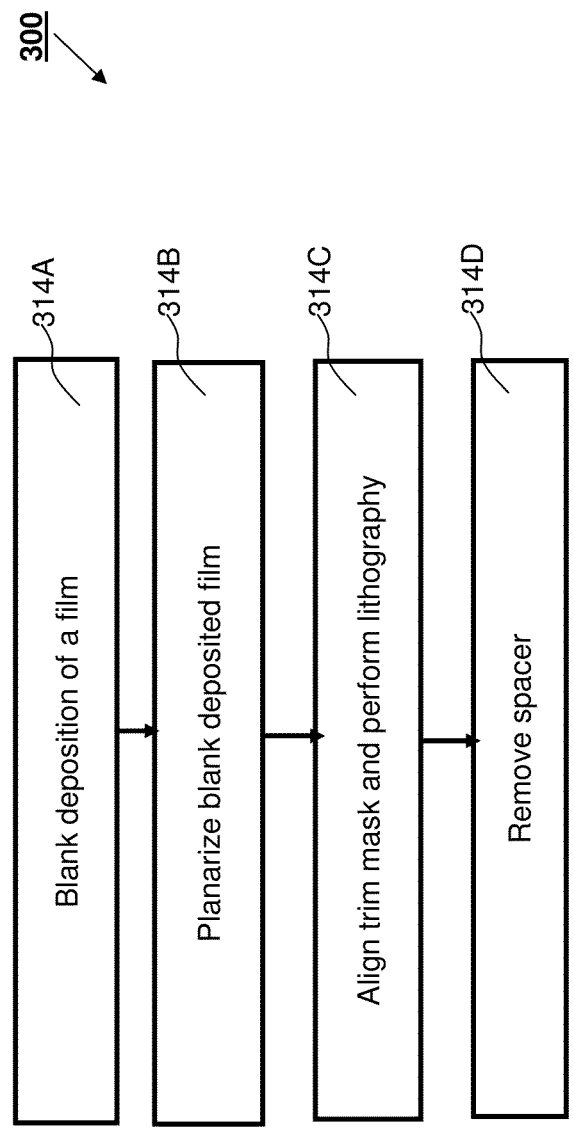

In step 214, the transfer of the design sub-layouts to the substrate is completed using the trim mask (from step 205) in a second lithography process, followed by required film deposition, trimming and spacer removal post-processes. Persons skilled in the art will appreciate that the second lithography and post-process flow in step 214 may be done in various standard ways, and using the trim mask is just one example discussed here (details of that example method is shown in FIG. 3). Bright field or dark field mask may be used depending on the tone of lithography adopted. In one embodiment, a bright field trim mask is used for line printing (shown in FIG. 11). In another embodiment, a dark field trim mask is used for space/trench printing (shown in FIG. 10).

In step 216, the entire target pattern is reproduced on the substrate. It is to be understood that if the original target layout was split into more than two sub-layouts, then at least some of the steps in flowchart 200 would need to be repeated, and more than two lithography steps would have been necessary, and more than two masks would have been used. For example, step 214 would have to be repeated until the entire target pattern is obtained in step 216.

Flowchart 300 in FIG. 3 shows one possible process flow where step 214 of flowchart 200 is specifically broken down into some key sub-steps. After features of the spacer-target sub-layout and the SAP features are already transferred onto the substrate, and the spacers are defined, in step 314A, a blank deposition of a film is performed. This blank deposited film fills the gaps between the spacers and/or features. The gaps may define positions of features from a sub-layout other than the spacer-target sub-layout. Due to the auto generated SAP features derived from the original design layout, the positioning of the features of the subsequent sub-layout is already self-aligned with the features of the first sub-layout, i.e., the spacer-target sub-layout.

In step 314B, the blank deposited film is planarized by CMP or etch back or using other planarizing methods. FIG. 12H shows this step for space printing, and FIG. 13C shows this step for line printing.

In step 314C, the trim mask is aligned to the already transferred lines and spaces defined by the SAP features and spacers. Again the use of the trim mask may be optional and this step is somewhat sensitive to overlay, but the criticality of the overlay is relatively relaxed, as the self-alignment of the individual sub-layouts have already been accomplished during the previous steps prior to step 314A (i.e., till step 212 in flowchart 200 in FIG. 2). Then a second lithography is performed using the aligned trim mask. FIG. 12G shows this step for space printing, and FIG. 13B shows this step for line printing.

In step 314D, the spacer is removed using chemical etching process or other methods, leaving only the original design layout features comprising the transferred sub-layouts interlaced with each other in a self-aligned manner. FIG. 12I shows this step for space printing, and FIG. 13D shows this step for line printing.

Persons skilled in the art will appreciate that the methods shown in FIGS. 2-3 only depict illustrative steps. Not all the steps need to be included in every embodiment, and additional intermediate/terminal steps may be included in the methods, as applicable. The sequence of the steps may be altered.

One of the most important issues for conventional double patterning lithography is the overlay control between two lithography steps. In order to faithfully reproduce the entire design layout, it is critically important to position ("overlay") the subsequent sub-layout with the highest precision with respect to the first sub-layout already transferred on the substrate via the first lithography step. If the overlay error gets bigger, CD uniformity gets worse, resulting in erroneous CD of the design layout's individual features (e.g., lines) and/or the spaces therebetween. For example, the linewidths of the features of the first sub-layout may be wider than what is intended, and the linewidths of the features of the subsequent sub-layout may be narrower than what is intended. Simultaneously, the spacing between the features may also deviate from what is intended. In the spacer-based multiple patterning lithography of the present invention, the positions of the subsequent sub-layout features are already defined during the first lithography step, because the SAP is derived with the positioning of subsequent sub-layout taken into account. Widths of the individual features and/or width of the spaces therebetween in the subsequent sub-layout are precisely defined after spacer deposition and etch. Therefore, the need for overlay control is eliminated, and CD uniformity is automatically achieved as a collateral benefit built into the multiple patterning lithography process flow because of the self-alignment aspect. The lithographer may choose to decompose the design layout into multiple parts/sub-layouts, each of the parts/sub-layouts having its own CD. The present invention does not need to adopt any special technique to address the CD uniformity issue. Therefore, the present invention is particularly suited for handling features with multiple CDs.

Examples of SAP and Target Patterns Reproduced Using SAP and Spacers

As discussed in the Background and Summary section, SAP features are auto generated features derived from the original design layout, that help in overcoming overlay-related errors in multiple patterning lithography.

Figure 4:
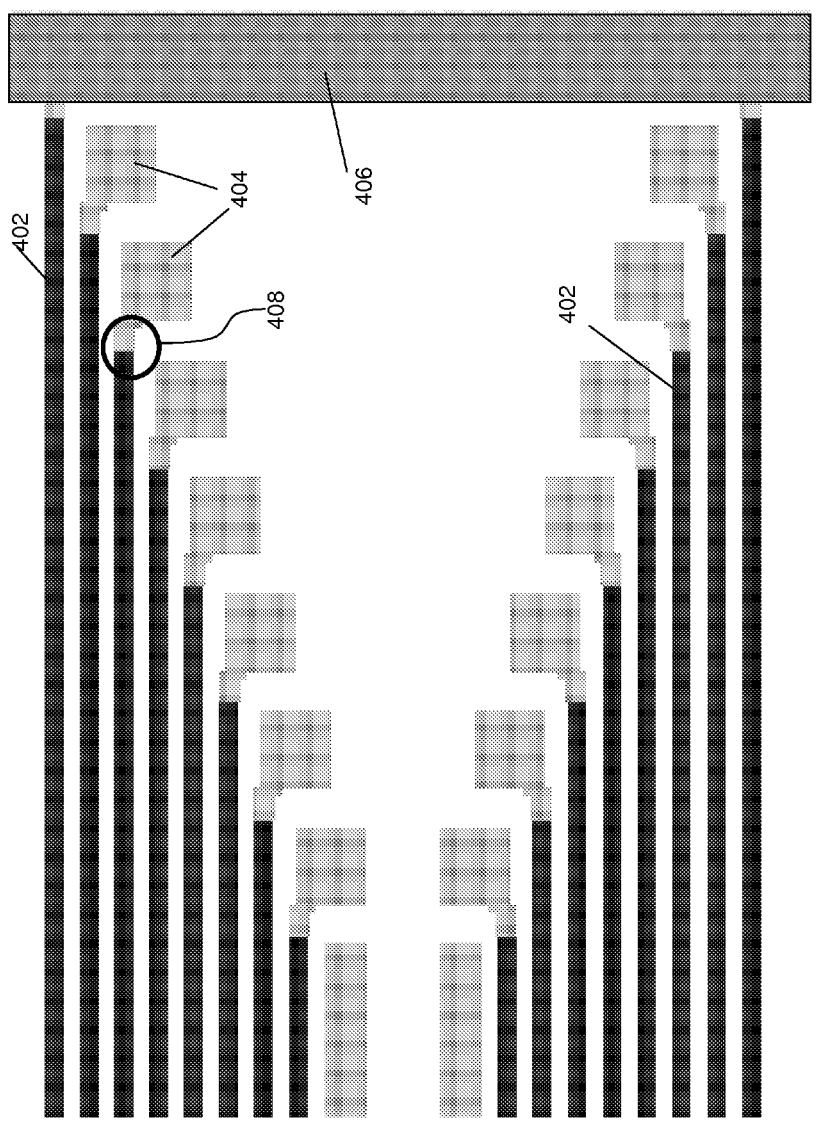
FIG. 4 illustrates an example of an overlay problem associated with a prior art method.

FIG. 4 schematically illustrates overlay problem associated with an existing double patterning method. The method requires patterning the critical features, i.e., the densely spaced lines 402 first, and then stitching the non-critical features, e.g., the pads 404 to the corresponding lines 402. An additional non-critical alignment bar 406 may be incorporated as an assist feature during double patterning. The area within the circular outline 408, where non-critical pads 404 are being aligned to critical lines 402, is highly sensitive to overlay error, as no self-alignment mechanism is being used here. One of the advantages of the present invention is that the process flow automatically eliminates the need for critical overlay control, as discussed above. Non-critical overlay control may or may not be necessary depending on the subsequent process flow, especially when an optional trim mask is used, as discussed above, and will be discussed further below.

FIG. 5A shows an example target pattern layout 500 seen in flash memory circuits. This layout 500 has densely placed lines 502 and corresponding pads 504. In the embodiments of the present invention, the lines 502 and pads 504 are not differentiated as critical and non-critical features. Rather, the entire layout 500 is decomposed into two colors, as shown in FIG. 5B. One color comprises the darker-shade features, and the other complementary color comprises the lighter-shade features. A spacer-target sub-layout in this example may or may not have features from both colors. As noted before, a layout may be decomposed into more than two sub-layouts, if required. Individual sub-layouts may have the same or different CDs with respect to each other. A set of features having a specific CD may be grouped into a single sub-layout or multiple sub-layouts. In general, a critical spacing between features in a single sub-layout is above the resolution limit of the lithography apparatus, so that the entire sub-layout may be printed in one lithographic exposure.

The area within the dashed outline 510 in FIG. 5B is shown in a magnified view in FIG. 5C, with the lighter-shade features shown in cross-hatch. SAP 512 is generated by identifying the peripheral edges of the entire layout 500, and adjusting the edges adjacent to the features of the second color, as shown within circular outlines 514, applying geometric Boolean rules. Note that a derived SAP may comprise a singular SAP feature, which is a continuous feature (such as, a single bar, a ring etc.), or the derived SAP may comprise plurality of SAP features (such as, multiple bars, multiple rings etc.). Plurality of SAP features may be connected to each other, but they may be discontinuous as well.

Figure 6D:
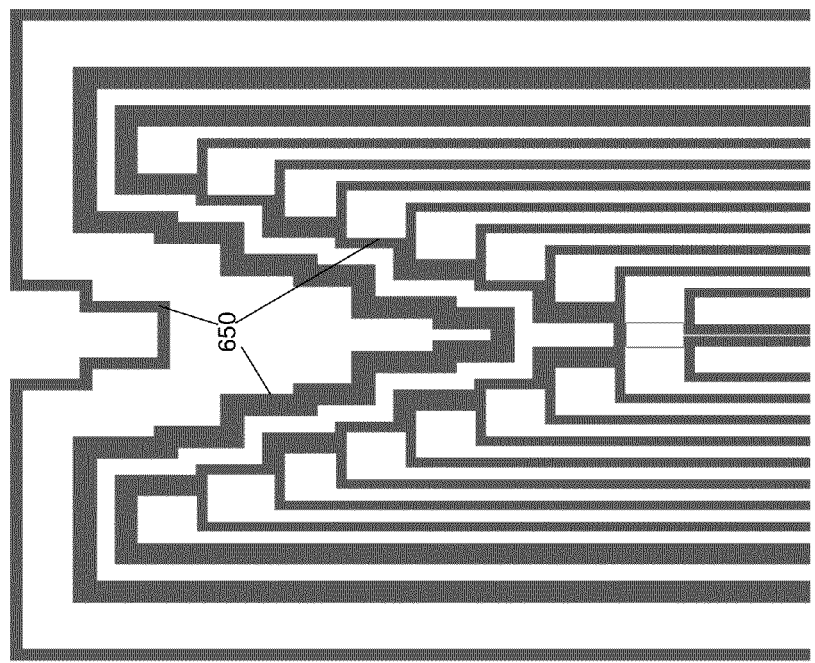

FIGS. 6A-6H show various sequential outcome (top view) of a process flow, according to an example of the present invention, using the layout 500 of FIG. 5A. In this example, two SAP rings are generated from the design layout 500: an inner ring 612, and an outer ring 614, separated from the inner ring 612 by a gap 613. The inner ring 612 is more critical in terms of fine-tuning of edges adjacent to the features of the second color (shown as the hollow features 620, in contrast to the solid features 622). The first lithography mask layout comprises an improved spacer-target sub-layout comprising the original spacer-target sub-layout features 622, and the SAP features (612 and 614). A portion of the mask layout is shown in FIG. 6A using dark-shaded solid features.

FIG. 6B shows an example post-OPC bright field mask layout 630, which is generated from layout 610 of FIG. 6A by applying OPC techniques. The OPC step is optional, and used for further resolution improvement beyond what is achieved by the methods of the present invention.

Figure 6C:
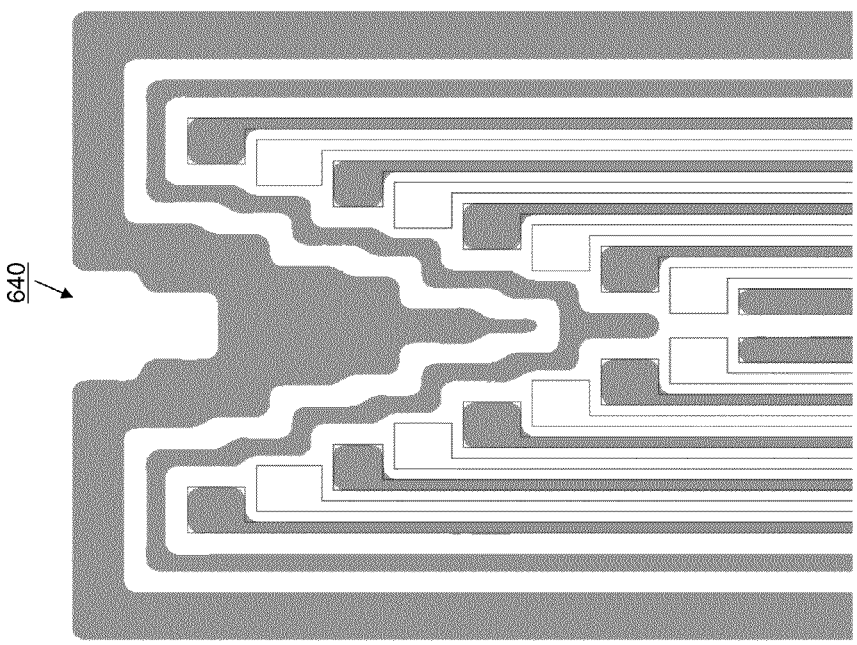

FIG. 6C shows a contour 640 after $1^{st}$ lithography and before spacer deposition.

FIG. 6D shows the pattern after spacer deposition and etch. Spacer film is shown by the dark features 650.

Figure 6E:
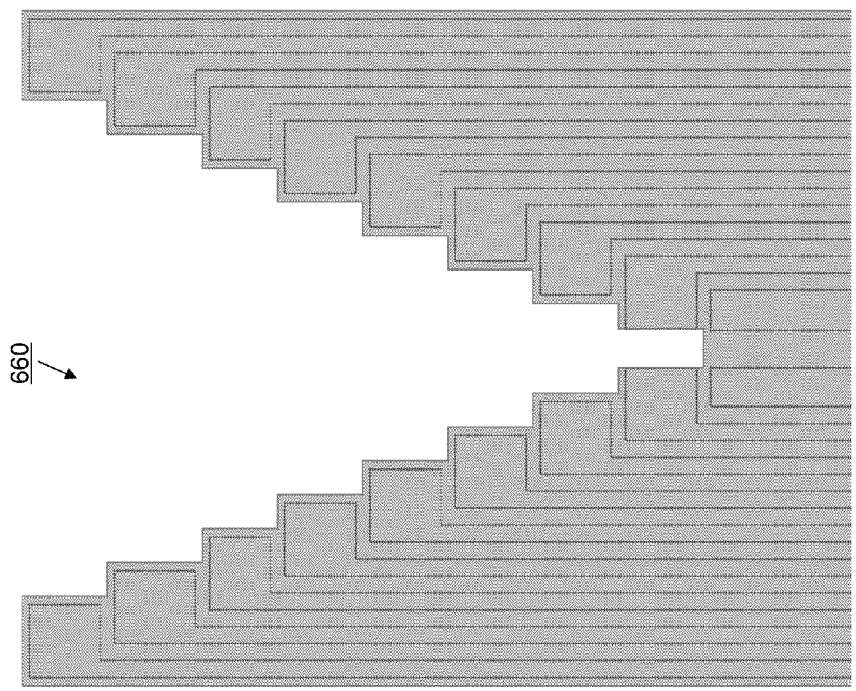

FIG. 6E shows a layout 660 of a trim mask.

Figure 6F:
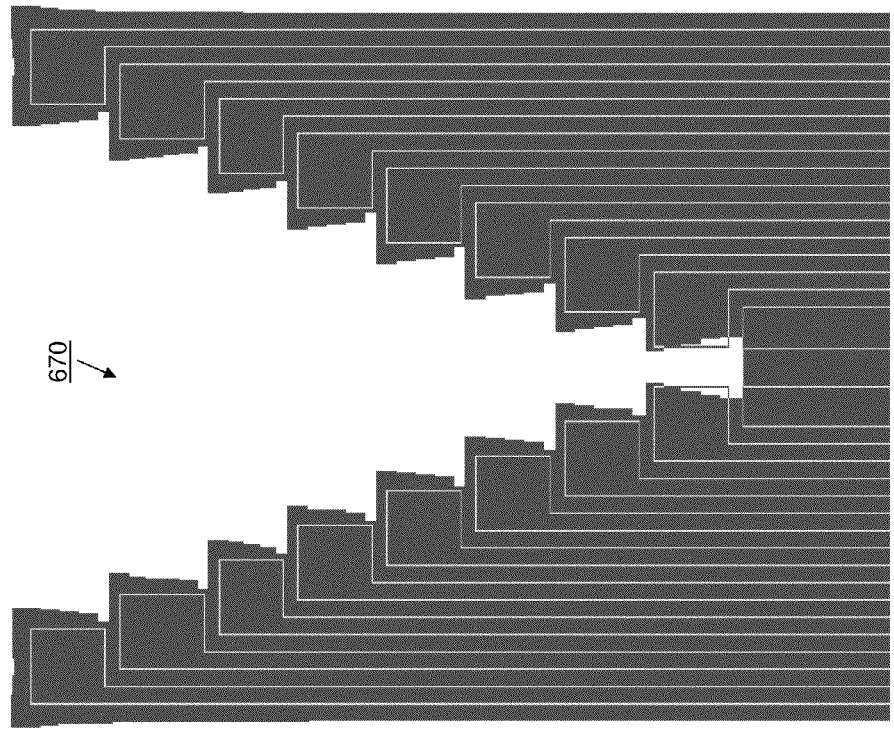

FIG. 6F shows a OPC-ed dark field trim mask layout 670 generated from layout 660 of FIG. 6E by applying OPC techniques. The OPC step is optional, and used for further resolution improvement.

Figure 6G:
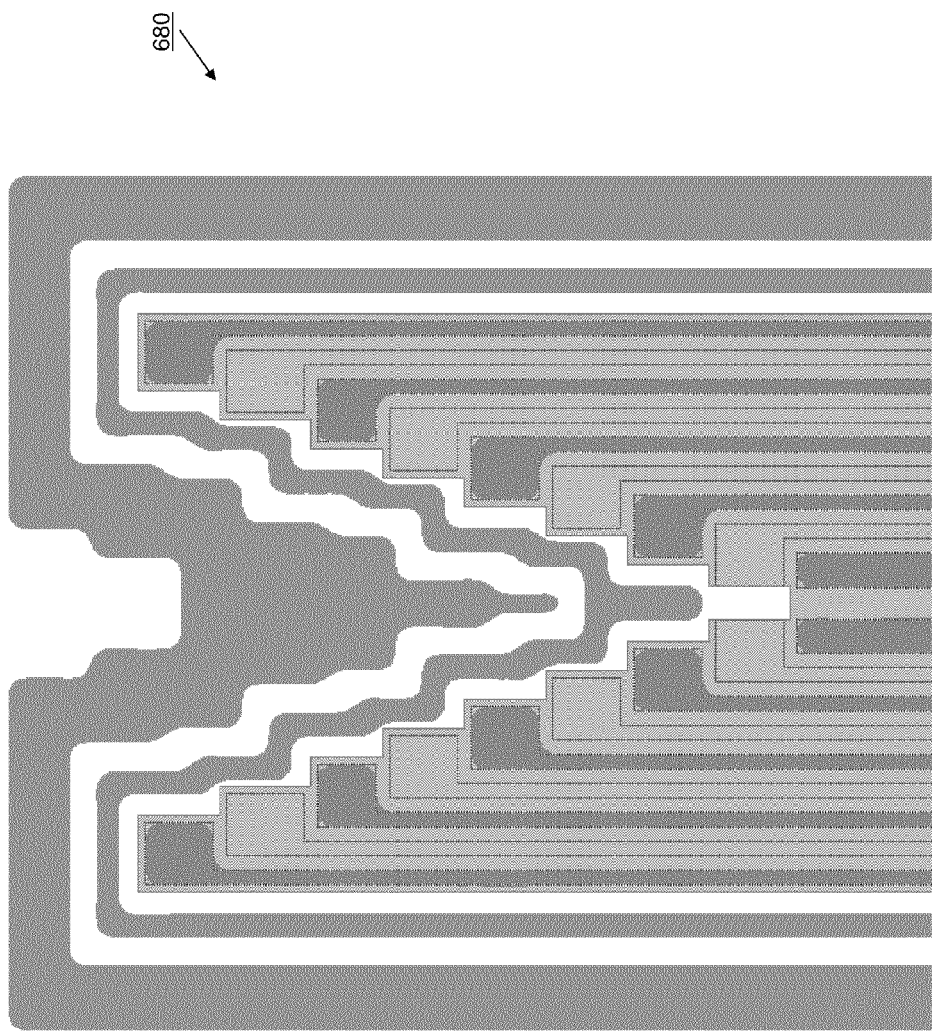

FIG. 6G shows the pattern on a substrate after second lithography using the trim mask.

Figure 6H:
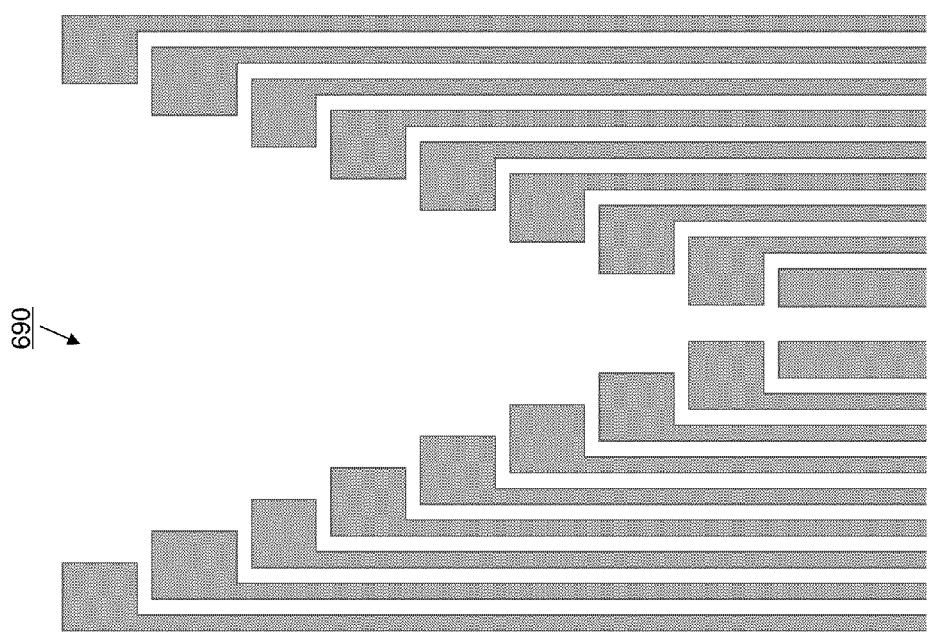

FIG. 6H shows how target layout 500 is reproduced as substrate pattern 690 after excess portions from the first lithography are trimmed off.

Figure 7:
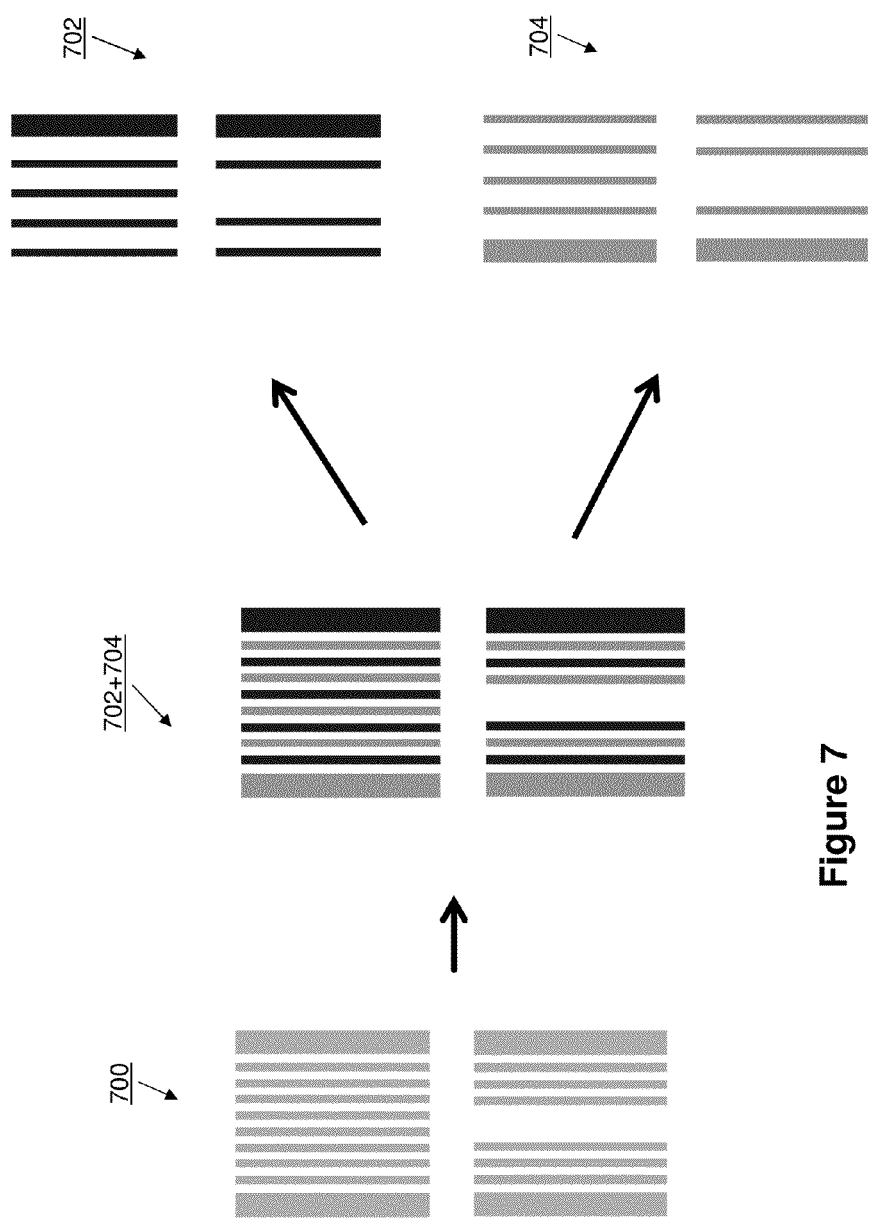
FIG. 7 shows an example of decomposition of a target pattern layout into multiple sub-layouts, according to an example embodiment of the present invention.

FIG. 7 shows another example of decomposition of a target pattern layout into multiple sub-layouts, according to an example embodiment of the present invention, where each sub-layout has features of one color. Target design layout 700 is colored by dividing the features into two colors, and sub-layouts 702 and 704 are created. Sub-layout 702 is printed in $1^{st}$ lithography step, and sub-layout 704 is printed in the second lithography step. Either of the sub-layouts 702 or 704 may be used to derive SAP features for the first lithography mask.

FIG. 8A-8B show how geometric Boolean operations are used to derive SAP features. FIG. 8A shows generation of SAP features without a peripheral ring, and FIG. 8B shows generation of peripheral SAP features with a peripheral ring. Total width and/or length of a target layout, as well as width/length of individual parts of a target layout are adjusted to generate the SAPs. For example, in FIG. 8A, intermediate pattern 802 is generated from total width/length of target layout 700, and intermediate pattern 804 is generated by from adjusting width/length of parts of sub-layouts 702 and 704 using a Boolean OR operation. Then final SAP pattern 806 (comprising various SAP features 808) is generated using Boolean NOT operation from patterns 802 and 804.

FIG. 8B shows similar Boolean operations to create intermediate patterns 810 and 812, though the width/length adjustment parameters may have been tuned or scaled differently compared to those in FIG. 8A. Additional Boolean NOT and OR operations create ring 814. Then final SAP pattern 818 with a ring (comprising various SAP features 816) is generated using Boolean NOT operation from patterns 810, 812, and 814.

Figure 9:
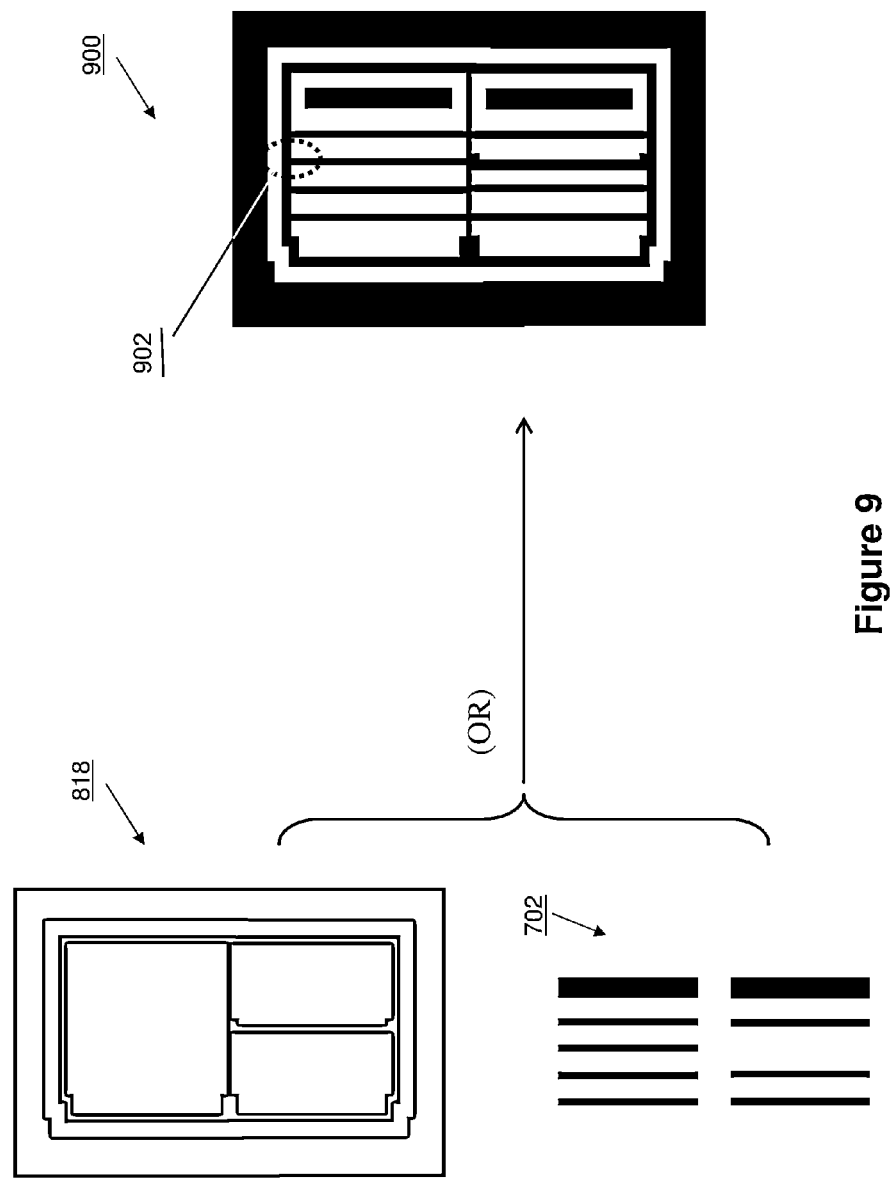
FIG. 9 illustrates completion of a lithographic mask layout generation including the peripheral SAPs of FIG. 8B, and additional SAP features.

FIG. 9 shows generation of improved spacer-target sub-layout 900 that includes SAP features in pattern 818, as well as features from the first sub-layout 702. Some of the line ends are extended to merge features of pattern 702 to the SAP features, as shown within the circular outline 902.

Figure 10:
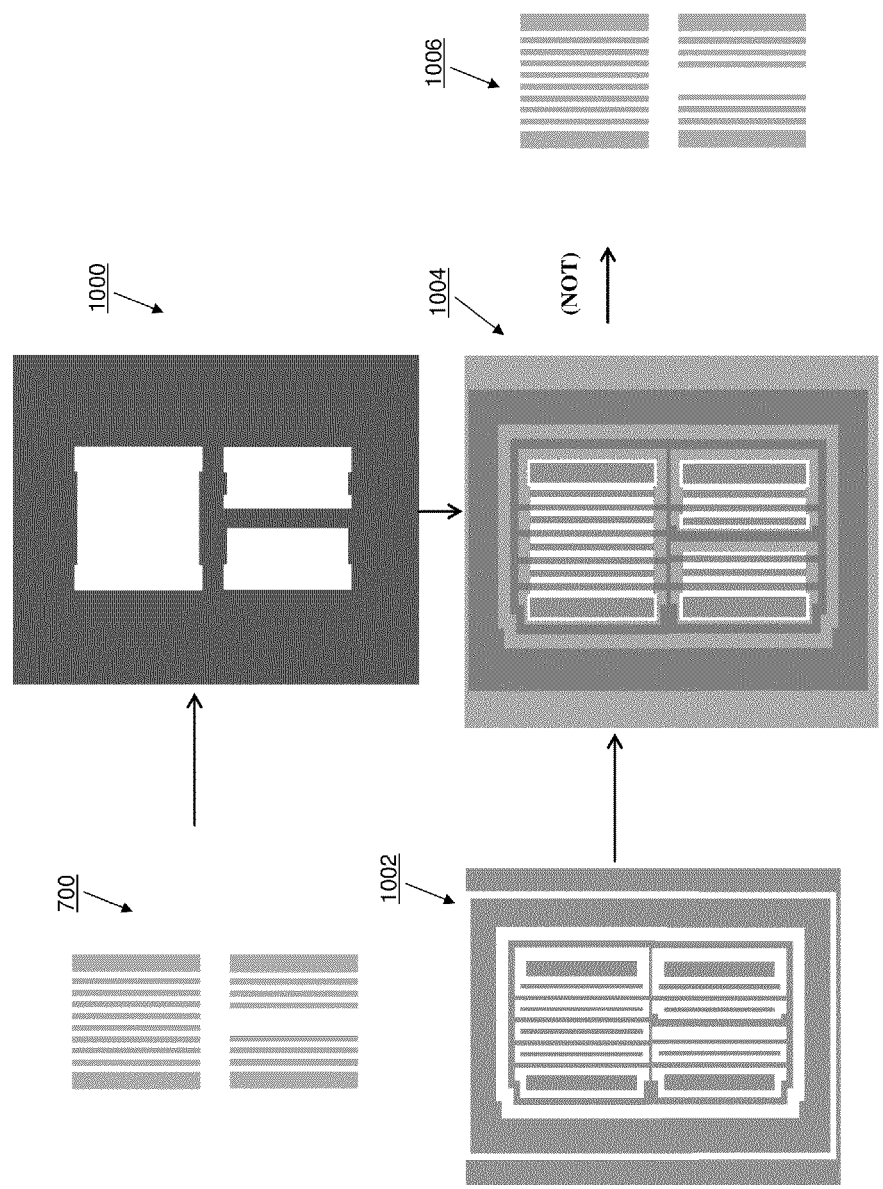

FIG. 10 shows dark field trim mask 1000, designed from layout target design 700 for space/trench printing. After spacer deposition and blanket film deposition (e.g., after step 314A in FIG. 3), the layout looks like pattern 1002 on the substrate. Trim mask 1000 is used for second lithography, and after subsequent trimming and spacer removal, target pattern 1006 is reproduced on the substrate.

FIG. 11 shows dark field trim mask 1100, designed from layout target design 700 for line printing. After spacer deposition and blanket film deposition (e.g., after step 314A in FIG. 3), the layout looks like pattern 1102 on the substrate. Trim mask 1100 is used for second lithography, and after subsequent trimming and spacer removal, target pattern 1106 is reproduced on the substrate.

In FIGS. 10 and 11, alignment of trim mask 1000 (or 1100) is overlay sensitive to certain extent. However, as this overlay is not critical as relative alignment of individual features of the sub-layouts, which are already self-aligned in previous process steps before the trim mask is brought into the process flow.

FIG. 12A shows a top view of an example process flow after the first lithography, where features 1202 from a target-spacer layout, and SAP features 1210 are printed, while features 1204 from the second sub-layout, shown with hatched patterns, are used in deriving the SAPs. The side view of FIG. 12A along cross section C1 is shown in FIG. 12C, where layer 1206 is the hard mask layer that mimics the SAP and the features of the target-spacer sub-layout for subsequent etching, and layer 1208 is the underlying dielectric layer on top of a substrate layer 1212. After etching, SAP features 1210 and spacer-target sub-layout features 1202 are defined on the substrate, as shown in FIG. 12D. FIG. 12B shows the top view after spacer deposition and post-processing. Spacer 1214 may be self-assembled, or lithographically patterned to be localized adjacent to the features 1202 and 1210, as shown in the side view of FIG. 12E, creating spaces/trenches in between to be filled by subsequent blank deposition of a film.

Figure 12F:
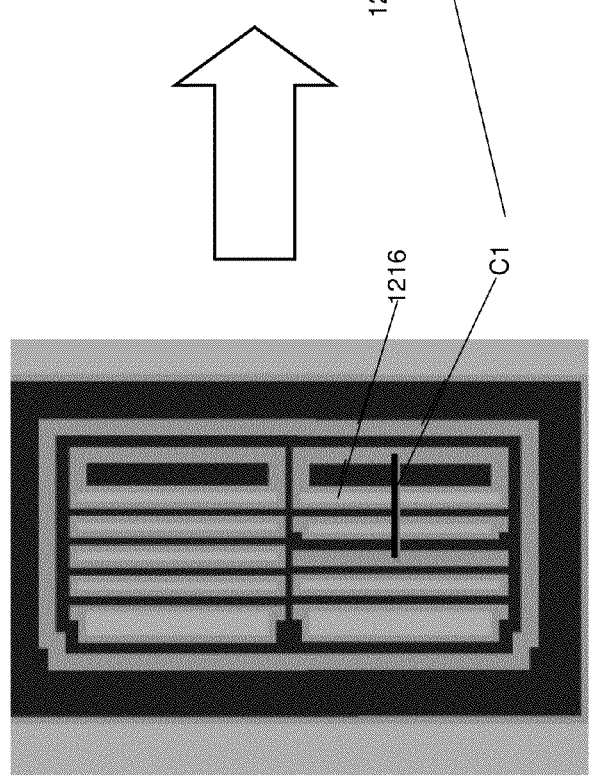
FIGS. 12F-12I depict remaining process flow following the step in FIG. 12E, when a positive photoresist process is adopted.
Figure 12G:
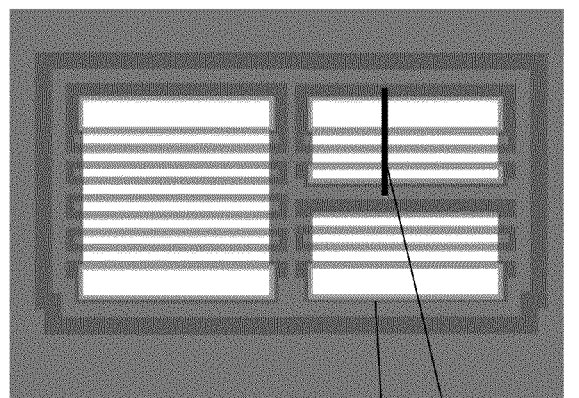
Figure 12H:
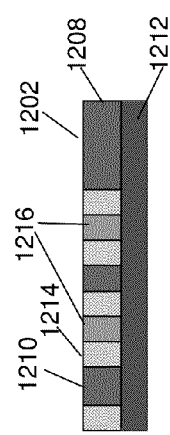
Figure 12I:
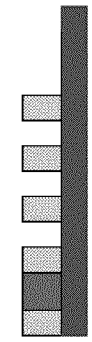

FIG. 12F shows the top view after blank deposition of film 1216. Cross sectional view along line C1 is shown in side view in FIG. 12H, showing the film 1216 filling the gaps in between spacer 1214. And finally, a dark field trim mask 1218, as shown in the top view of FIG. 12G is used for the second lithography process, followed by spacer removal to define space/trenches, as shown in the side view in FIG. 12I.

FIGS. 13A-D shows a process flow that is an alternative to the process flow in FIGS. 12F-I. Note that, the process flow up to FIGS. 12B (and 12E) remains the same for both the process flows.

FIG. 13A shows the top view after blank deposition of film 1216. Cross sectional view along line C1 is shown in side view in FIG. 13C, showing the film 1216 filling the gaps in between spacer 1214. And finally, a bright field trim mask 1318, as shown in the top view of FIG. 13B is used for the second lithography process, followed by spacer removal to define lines interspersed from self-aligned sub-layouts, as shown in the side view in FIG. 13D.

Persons skilled in the art will appreciate that the process flow shown in FIGS. 12 and 13 can be easily modified according to the tone of lithography chosen.

Figure 14:
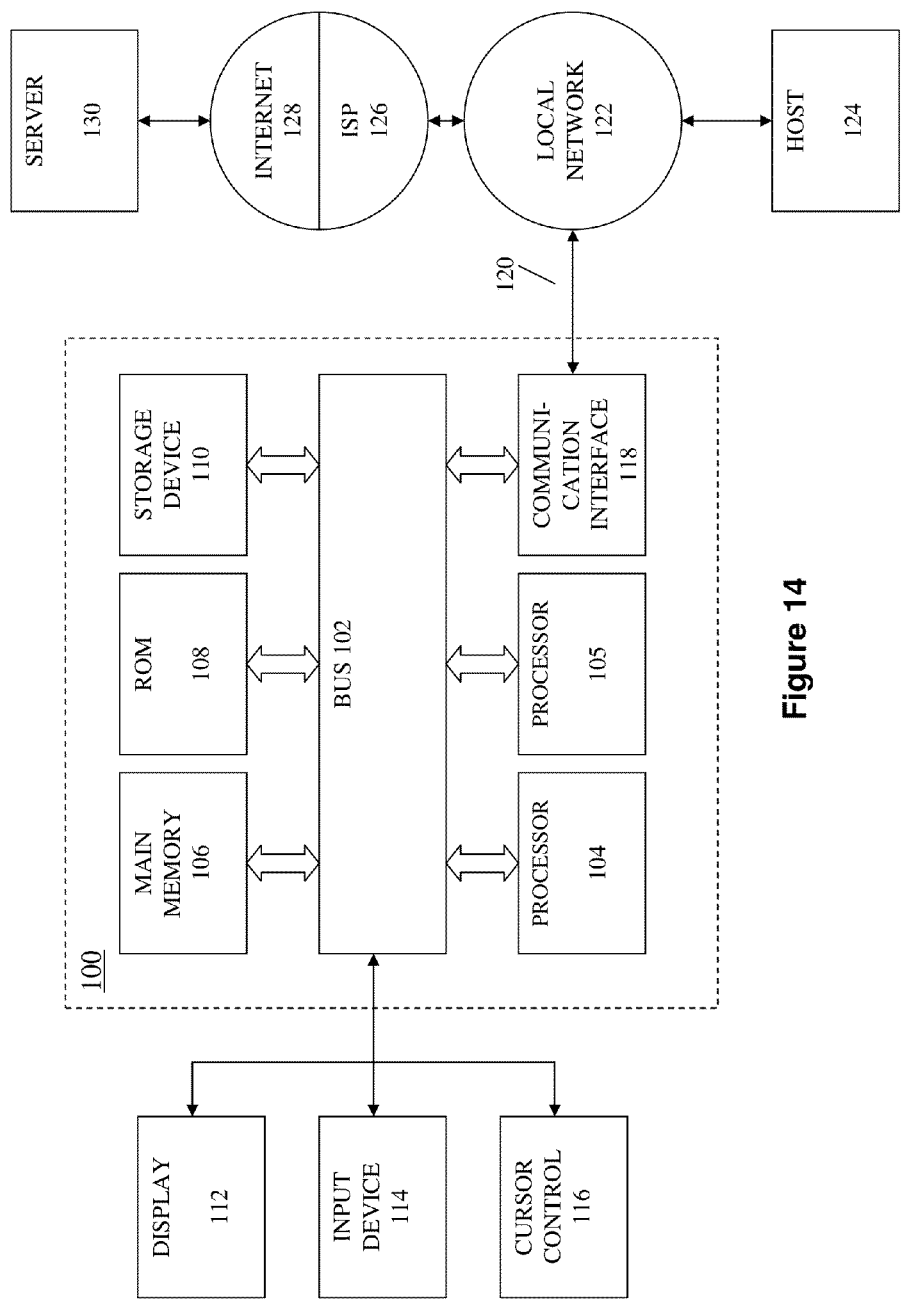
FIG. 14 is a block diagram that illustrates a computer system which can assist in the implementation of the simulation method of the present invention.

Details of a Computer System for Implementing the Embodiments of the Present Invention FIG. 14 is a block diagram that illustrates a computer system 100 which can assist in implementing the SAP derivation methods disclosed herein. Computer system 100 includes a bus 102 or other communication mechanism for communicating information, and a processor 104 coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment of the invention, portions of the SAP derivation and image transfer process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In alternative embodiments, hard-wired circuitry may be used in place of or in combination with software instructions to implement the invention. Thus, embodiments of the invention are not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 also preferably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. In accordance with the invention, one such downloaded application provides for the SAP derivation and placement rules of the embodiment, for example. The received code may be executed by processor 104 as it is received, and/or stored in storage device 110, or other non-volatile storage for later execution. In this manner, computer system 100 may obtain application code in the form of a carrier wave.

Example Lithography Tool

Figure 15:
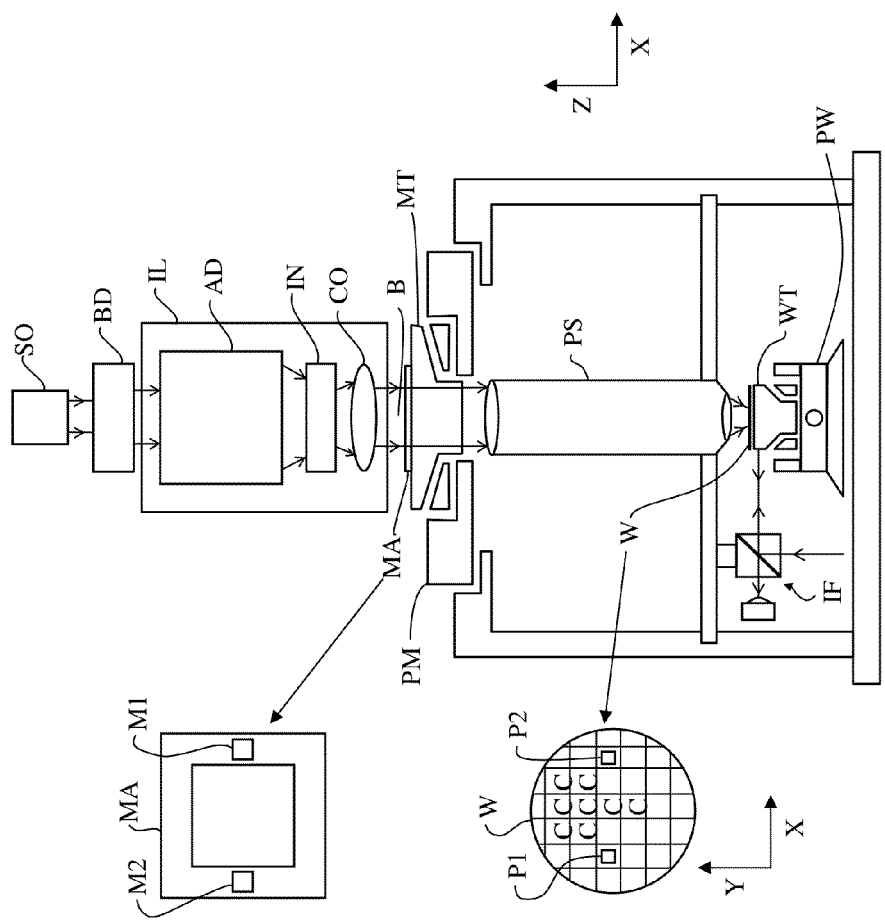
FIG. 15 schematically depicts a lithographic projection apparatus suitable for use with the method of the present invention.

FIG. 15 schematically depicts an exemplary lithographic projection apparatus for performing the lithographic image transfer process of the present invention. The apparatus comprises:
a radiation system Ex, IL, for supplying a projection beam PB of radiation. In this particular case, the radiation system also comprises a radiation source LA;
a first object table (mask table) MT provided with a mask holder for holding a mask MA (e.g., a reticle), and connected to first positioning means for accurately positioning the mask with respect to item PL;
a second object table (substrate table) WT provided with a substrate holder for holding a substrate W (e.g., a resist-coated silicon wafer), and connected to second positioning means for accurately positioning the substrate with respect to item PL;
a projection system ("lens") PL (e.g., a refractive, catoptric or catadioptric optical system) for imaging an irradiated portion of the mask MA onto a target portion C (e.g., comprising one or more dies) of the substrate W.

As depicted herein, the apparatus is of a transmissive type (i.e., has a transmissive mask). However, in general, it may also be of a reflective type, for example (with a reflective mask). Alternatively, the apparatus may employ another kind of patterning means as an alternative to the use of a mask; examples include a programmable mirror array or LCD matrix.

The source LA (e.g., a mercury lamp or excimer laser) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 15, that the source LA may be within the housing of the lithographic projection apparatus (as is often the case when the source LA is a mercury lamp, for example), but that it may also be remote from the lithographic projection apparatus, the radiation beam that it produces being led into the apparatus (e.g., with the aid of suitable directing mirrors); this latter scenario is often the case when the source LA is an excimer laser (e.g., based on KrF, ArF or $F_2$ lasing). The current invention encompasses at least both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g., after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 15. However, in the case of a wafer stepper (as opposed to a step-and-scan tool) the mask table MT may just be connected to a short stroke actuator, or may be fixed.

The depicted tool can be used in two different modes:
In step mode, the mask table MT is kept essentially stationary, and an entire mask image is projected in one go (i.e., a single "flash") onto a target portion C. The substrate table WT is then shifted in the x and/or y directions so that a different target portion C can be irradiated by the beam PB;
In scan mode, essentially the same scenario applies, except that a given target portion C is not exposed in a single "flash". Instead, the mask table MT is movable in a given direction (the so-called "scan direction", e.g., the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

The concepts disclosed herein may representing any generic imaging system for imaging dense features, and may be especially useful with emerging imaging technologies capable of producing wavelengths of an increasingly smaller size. Emerging technologies already in use include EUV (extreme ultra violet) lithography that is capable of producing a 193 nm wavelength with the use of a ArF laser, and even a 157 nm wavelength with the use of a Fluorine laser. Moreover, EUV lithography is capable of producing wavelengths within a range of 20–5 nm by using a synchrotron or by hitting a material (either solid or a plasma) with high energy electrons in order to produce photons within this range. Because most materials are absorptive within this range, illumination may be produced by reflective mirrors with a multi-stack of Molybdenum and Silicon. The multi-stack mirror has a 40 layer pairs of Molybdenum and Silicon where the thickness of each layer is a quarter wavelength. Even smaller wavelengths may be produced with X-ray lithography. Typically, a synchrotron is used to produce an X-ray wavelength. Since most material is absorptive at x-ray wavelengths, a thin piece of absorbing material defines where features would print (positive resist) or not print (negative resist).

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

The invention may be further described using the following clauses:

1. A method of improving a spacer-based multiple patterning lithography process for transferring a target pattern comprising a plurality of features to a substrate, the method comprising the steps of:

decomposing a design layout of the target pattern into a plurality of sub-layouts for the spacer-based multiple patterning lithography process, at least one of the multiple sub-layouts being a spacer-target sub-layout comprising features being configured to an addition of spacer material after patterning of the spacer-target sub-layout to the substrate;

deriving a self-aligned assist pattern (SAP), wherein the SAP is configured to define at least an edge of a feature included in a sub-layout other than the spacer-target sub-layout;

adding the SAP to the spacer-target sub-layout for generating an improved spacer-target sub-layout, and transferring the target pattern to the substrate via the spacer-based multiple patterning lithography process that uses the improved spacer-target sub-layout in a lithographic mask, wherein the spacer-based multiple patterning lithography is configured to accommodate multiple critical dimensions.

The descriptions above are intended to be illustrative, not limiting. Thus, it will be apparent to one skilled in the art that modifications may be made to the invention as described without departing from the scope of the claims set out below.

What is claimed is:

1. A computer-implemented method of improving a spacer-based multiple patterning lithography process for transferring a target pattern comprising a plurality of features to a substrate, the method comprising the steps of:

decomposing, using the computer, a design layout of the target pattern into a plurality of sub-layouts for the spacer-based multiple patterning lithography process, at least one of the plurality of sub-layouts being a spacer-target sub-layout comprising features being configured to an addition of spacer material after patterning of the spacer-target sub-layout to the substrate;

deriving, using the computer, a self-aligned assist pattern (SAP), wherein the SAP is configured to define at least an edge of a feature included in a sub-layout other than the spacer-target sub-layout;

adding, using the computer, the SAP to the spacer-target sub-layout for generating an improved spacer-target sub-layout, and using the improved spacer-target sub-layout to design a lithographic mask that is used to transfer the target pattern to the substrate via the spacer-based multiple patterning lithography process.

2. The method of claim 1, wherein a singular SAP feature or a plurality of SAP features are configured to define a set of features of the sub-layout other than the spacer-target sub-layout.

3. The method of claim 2, wherein the singular SAP feature is configured to self-align an edge of a feature, or wherein the plurality of SAP features are configured to self-align multiple patterns in the spacer-based multiple patterning lithography process.

4. The method of claim 1, wherein a positioning of the edge of the feature of the sub-layout other than the spacer-target sub-layout is relatively more critical with respect to features of the spacer-target sub-layout.

5. A computer-implemented method for designing a mask for transferring a target pattern on a substrate using a lithographic process used by a lithographic apparatus, the method comprising:

(a) decomposing, using the computer, a design layout of the target pattern into at least two design sub-layouts;

(b) deriving, using the computer, a self-aligned assist pattern (SAP) from the design layout;

(c) including, using the computer, the derived SAP in an improved design sub-layout, wherein the improved design sub-layout includes features of at least one sub-layout and the derived SAP; and (d) using the improved design sub-layout as a mask layout to produce a mask, wherein the mask is used in the lithographic process, the lithographic process including:

lithographically transferring a first sub-layout and the derived SAP on the substrate using the mask prior to formation of a spacer; and after the formation of the spacer, lithographically transferring a subsequent sub-layout on the substrate, such that the transferred subsequent sub-layout is self-aligned with the transferred first sub-layout.

6. The method of claim 5, wherein one or more of the following is below a resolution limit of the lithographic apparatus: at least one critical spacing between individual features included in the target pattern; and, at least one critical dimension of an individual feature of the target pattern.

7. The method of claim 5, wherein the step of deriving the SAP includes:

identifying peripheral edges of the design layout of the target pattern; and adjusting peripheral edges adjacent to features included in at least one of the sub-layouts.

8. The method of claim 5, wherein the step of deriving the SAP further includes:

identifying a peripheral edge in the design layout of the target pattern; and using geometric Boolean operations to derive one or more SAP features, wherein the one or more SAP features facilitate in self-alignment of the features of the sub-layouts.

9. The method of claim 5, wherein the formation of the spacer includes:
depositing a spacer material layer; and
patterning the spacer material layer.

10. The method of claim 9, wherein the deposited spacer material is planarized by chemical-mechanical polishing or etch back.

11. The method of claim 5, wherein lithographically transferring the subsequent sub-layout of the target pattern on the substrate further includes:
blank depositing a film layer on the substrate.

12. The method of claim 11, wherein the deposited film layer is planarized by chemical-mechanical polishing or etch back.

13. The method of claim 5, wherein the lithographic process further includes:
performing post-lithography processing to complete transfer of the target pattern on the substrate.

14. The method of claim 13, wherein the post-lithography processing includes:
removing at least a part of the spacer.

15. The method of claim 13, wherein the post-lithography processing includes:
after lithographically transferring the first sub-layout and the derived SAP, lithographically trimming excess portions of the features and SAP to delineate the desired target pattern.

16. The method of claim 5, wherein a tone of a photoresist used for lithographic process is selected based on a spacing or a dimension below a resolution limit of the lithographic apparatus.

17. The method of claim 5, wherein the sub-layouts do not differentiate between critical features and non-critical features.

18. The method of claim 5, wherein the method is configured to accommodate multiple critical dimensions during the lithographic process because of self-alignment achieved by using SAP.

* * * * *